(12) United States Patent
Yang et al.

(10) Patent No.: US 12,233,639 B2
(45) Date of Patent: Feb. 25, 2025

(54) SOURCE WAFER, METHOD, AND OPTOELECTRONIC DEVICES

(71) Applicant: ROCKLEY PHOTONICS LIMITED, Altrincham (GB)

(72) Inventors: Hua Yang, Cork (IE); Mohamad Dernaika, Cork (IE); Frank Peters, Cork (IE); Guomin Yu, Glendora, CA (US)

(73) Assignee: Rockley Photonics Limited, Altrincham (GB)

( * ) Notice: Subject to any disclaimer, the term of this patent is extended or adjusted under 35 U.S.C. 154(b) by 173 days.

(21) Appl. No.: 17/938,282

(22) Filed: Oct. 5, 2022

(65) Prior Publication Data

US 2023/0105335 A1    Apr. 6, 2023

(30) Foreign Application Priority Data

Oct. 5, 2021    (GB) .................................... 2114242

(51) Int. Cl.
*B32B 27/02* (2006.01)
*B41F 16/00* (2006.01)
*H01L 21/683* (2006.01)

(52) U.S. Cl.
CPC ...... *B41F 16/0066* (2013.01); *H01L 21/6835* (2013.01); *H01L 2221/68318* (2013.01); *H01L 2221/68363* (2013.01)

(58) Field of Classification Search
CPC ............ B01D 19/0409; B01D 19/0413; B41F 16/0066; H01L 21/6835; H01L 2221/68318; H01L 2221/68354; H01L 2221/68363; H01L 2221/68381; H01L 31/0304; H01L 31/184; H01L 31/1892; H01L 33/0095; H01L 33/30
See application file for complete search history.

(56) References Cited

U.S. PATENT DOCUMENTS

| | | | |
|---|---|---|---|
| 2004/0147092 A1 | 7/2004 | Liao et al. | |
| 2016/0351747 A1* | 12/2016 | Forrest | ............... H01L 31/0693 |
| 2018/0269234 A1 | 9/2018 | Hughes et al. | |
| 2019/0027075 A1 | 1/2019 | Hughes et al. | |
| 2019/0326149 A1 | 10/2019 | Bower et al. | |

(Continued)

FOREIGN PATENT DOCUMENTS

| | | |
|---|---|---|
| CN | 104810444 A | 7/2015 |
| GB | 2595211 A | 11/2021 |
| TW | 201113940 A1 | 4/2011 |

OTHER PUBLICATIONS

U.K. Intellectual Property Office Search and Examination Report, dated Apr. 1, 2022, for Patent Application No. GB2114242.7, 9 pages.

(Continued)

*Primary Examiner* — Lawrence D Ferguson
(74) *Attorney, Agent, or Firm* — Womble Bond Dickinson LLP

(57) ABSTRACT

A source wafer for use in a micro-transfer printing process. The source wafer comprising: a wafer substrate; a photonic component, provided in a device coupon, the device coupon being attached to the wafer substrate via a release layer; and one or more etch stop layers, located between the photonic component and the wafer substrate.

17 Claims, 3 Drawing Sheets

(56) References Cited

U.S. PATENT DOCUMENTS

2021/0066537 A1 3/2021 Yu
2021/0183834 A1 6/2021 Rügheimer et al.

OTHER PUBLICATIONS

International Search Report and Written Opinion of the International Searching Authority, mailed Feb. 3, 2023, corresponding to PCT/EP2022/077727, 18 pages.
U.K. Intellectual Property Office Examination Report, dated Sep. 24, 2024, for Patent Application No. GB2114242.7, 8 pages.

\* cited by examiner

SOURCE WAFER, METHOD, AND OPTOELECTRONIC DEVICES

CROSS-REFERENCE TO RELATED APPLICATION(S)

This application claims priority to United Kingdom Patent Application No. 2114242.7, filed in the United Kingdom Intellectual Property Office on Oct. 5, 2021, entitled "SOURCE WAFER, METHOD, AND OPTOELECTRONIC DEVICES", which is incorporated by reference herein in its entirety.

FIELD OF THE INVENTION

The present invention relates to a source wafer, methods, and optoelectronic devices.

BACKGROUND

Micro-transfer print (MTP) is an emerging technique to integrate devices made from one materials system to a substrate formed of a different materials system. For example, to integrate III-V semiconductor based devices onto a silicon platform or host wafer. During the fabrication process of printable devices, a notable step as compared to non-MTP processes is the lift off of the epitaxial layers (e.g. the device coupon) from the substrate by removing a sacrificial or release layer between the epitaxial layers and the substrate. This is usually performed through wet chemical etching, which selectively etches the sacrificial layer and so removes the sacrificial layer leaving a gap between the bottom of the coupon and the substrate.

On the one hand, obtaining a flat or smooth bottom surface of the coupon is important for printing the lifted coupon onto the target substrate, e.g. silicon. The flatness of the surface depends on the selectivity of the wet etching to the sacrificial layer from the layer on the coupon's back (e.g. lower surface). Typically this selectivity is not high enough, or requires additional complexities to provide the relevant conditions (e.g. very low temperatures). This results in bowing of the bottommost surface of the device coupon, which can negatively affect the bonding of the device coupon to a host wafer.

On the other hand, one of the advantages of the MTP process is that the substrate can be reused after lift off of the device coupon/epitaxial coupon so as to reduce cost. To enable this, the surface of the substrate should be very flat and smooth to facilitate epitaxial growth.

SUMMARY

Accordingly, in a first aspect, embodiments of the invention provide a source wafer, for use in a micro-transfer printing process, the source wafer comprising:
- a wafer substrate;
- a photonic component, provided in a device coupon, the device coupon being attached to the wafer substrate via a release layer; and
- one or more etch stop layers, located between the photonic component and the wafer substrate.

The provision of such an etch stop layer provides an improved source wafer for use in a micro-transfer printing process.

Optional features of the invention will now be set out. These are applicable singly or in any combination with any aspect of the invention.

An etch stop layer of the one or more etch stop layers, e.g. a first etch stop layer, may be located between the photonic component and the release layer. By providing an etch stop layer between these layers, the bottommost surface of the device coupon (i.e. the one nearest the wafer substrate) can be made flatter which can improve the yield when the device coupon is printed onto a platform wafer. The source wafer may further comprise an intermediate semiconductor layer, located between the etch stop layer and the release layer. This intermediate semiconductor layer allows substrate reclaim. By etching away this layer with a wet etch, the substrate with an etch stop layer above it can be reused immediately and without any further CMP processes. This reduces the substrate reclaim costs and processing time.

An etch stop layer of the one or more etch stop layers, e.g. a second etch stop layer, may be located between the release layer and the wafer substrate. By providing an etch stop layer between these layers, the wafer substrate can be preserved after the device coupon has been removed and so a further device coupon can be provided thereon. The source wafer may include an intermediate substrate layer, located between the release layer and the etch stop. It is from this intermediate substrate layer that the original device coupon may have been grown. The intermediate substrate layer may be at least 50 nm thick, or at least 500 nm thick, and/or no more than 800 nm thick.

The release layer may be at least 450 nm thick, and/or no more than 550 nm thick, and may be 500 nm thick or around 500 nm thick.

The or each etch stop layer may be formed of a plurality of sub-layers, two or more of the sub-layers of the plurality of sub-layers being formed of respectively a different materials. In some embodiments each of the sub-layers is formed of a respectively different material to the other sub-layers.

The or each etch stop layer may be at least 15 nm thick and/or no more than 25 nm thick, and may be 20 nm thick or around 20 nm thick.

The or each etch stop layer may be formed from a III-V semiconductor. The or each etch stop layer may be formed from one of: InGaAsP, InGaAs, AlInGeAs and InP. Where the or each etch stop layer is formed of a plurality of sub-layers, two or more of the sub-layers of the plurality of sub-layers being formed of respectively different III-V semiconductors or combinations of III-V semiconductors.

The photonic component may comprise a plurality of semiconductor layers, and may include one or more doped layers and one or more active layers. The semiconductor layers may be III-V semiconductor layers. The photonic component may be an optoelectronic device, for example a modulator, a laser, or a photodiode. The photonic component may be a waveguide, and may be an active waveguide (e.g. one in which properties of the light passing therethrough are actively changed) or a passive waveguide (e.g. one in which properties of the light passing therethrough are not actively changed). The photonic component may be formed, at least in part, of a III-V semiconductor.

The wafer substrate may be formed from a III-V semiconductor.

In a second aspect, embodiments of the invention provide a method of processing a source wafer for a micro-transfer printing process, the source wafer including:
- a wafer substrate;
- a photonic component, provided in a device coupon, the device coupon being attached to the wafer substrate via a release layer; and
- an etch stop layer, provided in the device coupon, located between the photonic component and the release layer;

the method including a step of etching away the release layer, so as to release the device coupon from the wafer substrate.

Advantageously, the etch stop layer functions to make the bottommost surface of the device coupon (i.e. the one closest to the wafer substrate, which may or may not be the etch stop layer) flatter.

The method may further comprise lifting the photonic component away from the wafer substrate, and depositing it onto a platform wafer so as to provide an optoelectronic device.

The source wafer may have any one, or any combination insofar as they are compatible, of the optional features of the source wafer of the first aspect.

In a third aspect, embodiments of the invention provide an optoelectronic device, produced using the method of the second aspect.

It may be possible to determine that the optoelectronic device of the third aspect was produced using the method of the second aspect by, for example: investigating a layer structure of the optoelectronic device from across section, secondary ion mass spectrometry analysis to identify epilayers; x-ray diffraction analysis to analyse epi layer crystal structure; x-ray photoelectron spectroscopy analysis of the source wafer; and/or investigation of the degree of flatness of the device coupon's lowermost surface In a fourth aspect, embodiments of the invention provide a method of processing a source wafer, the source wafer including:
 a wafer substrate;
 a photonic component, provided in a device coupon, the device coupon being attached to the wafer substrate via a release layer; and
 an etch stop layer, located between the release layer and the wafer substrate; the method including steps of:
 etching away the release layer;
 lifting away the device coupon; and
 etching away the etch stop, to expose the wafer substrate.

Advantageously, the etch stop layer functions to preserve the structure of the wafer substrate (e.g. ensure it is flat, without needing polishing) so that the wafer can be reused.

The source wafer may have any one, or any combination insofar as they are compatible, of the optional features of the source wafer of the first aspect.

The source wafer may further comprise an intermediate substrate layer, located between the release layer and the etch stop; and the method may further comprise etching away the intermediate substrate layer before or after the device coupon has been lifted away.

The method may further comprise depositing the device coupon onto a platform wafer so as to provide an optoelectronic device.

The method may further comprise growing a further release layer on the exposed wafer substrate, and a further device coupon on the further release layer, the further device coupon including a further photonic component. The method may further comprise etching away the further release layer, lifting away the further device coupon, and depositing the further device coupon onto a platform wafer so as to provide a further optoelectronic device.

The method may further comprise growing:
 first, a replacement etch stop layer above the wafer substrate;
 second, a replacement release layer, above the replacement etch stop; and
 third, a new device coupon including a new photonic component, above the replacement release layer.

The method may further include a step, performed between the first and second steps, of growing a replacement intermediate substrate layer above the replacement etch stop layer.

The method may further comprise etching away the replacement release layer, lifting away the new device coupon, and depositing the new device coupon onto a platform wafer.

Herein, above may refer to a direction away from the wafer substrate, e.g. normal to the extension of the wafer substrate and away from it. Similarly below may refer to a direction towards the wafer substrate.

In a fifth aspect, embodiments of the invention provide an optoelectronic device produced using the method of the fourth aspect.

It may be possible to determine that the optoelectronic device of the fifth aspect was produced using the method of the fourth aspect by, for example: investigating a layer structure of the optoelectronic device from across section, secondary ion mass spectrometry analysis to identify epilayers; x-ray diffraction analysis to analyse epi layer crystal structure; x-ray photoelectron spectroscopy analysis of the source wafer; and/or investigation of the degree of flatness of the device coupon's lowermost surface In a sixth aspect, embodiments of the invention provide an optoelectronic device, including:
 a platform wafer; and
 a photonic component, provided in a device coupon, the photonic component being bonded to the platform wafer;
 wherein an etch stop layer, provided in the device coupon, is located between the photonic component and the platform wafer.

Advantageously, the etch stop layer functions to make the bottommost surface of the device coupon (i.e. the one closest to the platform substrate, which may or may not be the etch stop layer) flatter and so improves adhesion.

The source wafer may have any one, or any combination insofar as they are compatible, of the optional features of the source wafer of the first aspect.

In a seventh aspect, embodiments of the invention provide a method of preparing a source wafer, including the steps of:
 growing, on a wafer substrate, a device coupon including a photonic component, which is attached to the wafer substrate via a release layer; and
 growing, between the photonic component and the wafer substrate, one or more etch stop layers.

The source wafer may have any one, or any combination insofar as they are compatible, of the optional features of the source wafer of the first aspect.

An etch stop layer of the one or more etch stop layers, e.g. a first etch stop layer, may be grown between the photonic component and the release layer. An etch stop layer of the one or more etch stop layers, e.g. a second etch stop layer, may be grown between the release layer and wafer substrate. Growing, herein, may refer to epitaxial crystalline growth. The step of growing the one or more etch stop layers may be performed before, after, or as a part of the step of growing the device coupon. In embodiments where the second etch stop layer is grown between the release layer and the substrate, the step of growing the etch layer is performed before growing the device coupon. In embodiments where the first etch stop layer is grown between the photonic component and the release layer, the step of growing the etch layer is performed as a part of growing the device coupon. In examples where a first and second etch stop layers are grown, these may be grown at different times.

Herein, etch stop layer may refer to a layer which is resistant to an etchant used for etching the wafer substrate and/or the release layer. For example, the etch stop layer may be made from a material which is different to the material used to make the wafer substrate and/or release layer.

The invention includes the combination of the aspects and preferred features described except where such a combination is clearly impermissible or expressly avoided.

Further aspects of the present invention provide: a computer program comprising code which, when run on a computer, causes the computer to perform the method of the first, fourth and/or seventh aspects; a computer readable medium storing a computer program comprising code which, when run on a computer, causes the computer to perform the method of the first, fourth and/or seventh aspects; and a computer system programmed to perform the method of the first, fourth and/or seventh aspects.

BRIEF DESCRIPTION OF THE DRAWINGS

Embodiments of the invention will now be described by way of example with reference to the accompanying drawings in which.

DETAILED DESCRIPTION OF THE DRAWINGS

Aspects and embodiments of the present invention will now be discussed with reference to the accompanying figures. Further aspects and embodiments will be apparent to those skilled in the art.

Figure 1:
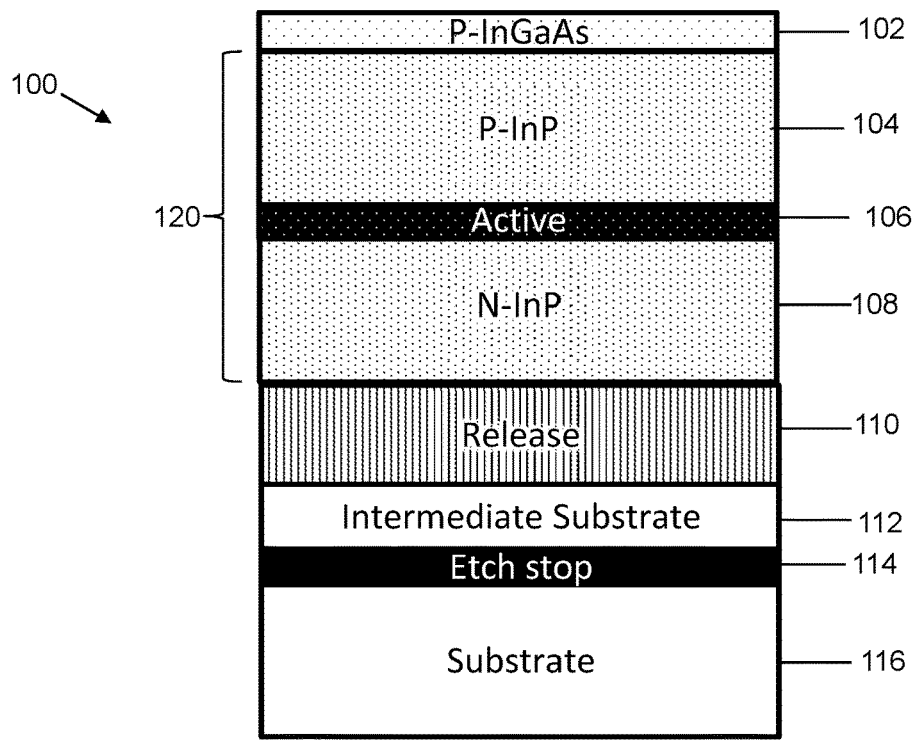
FIG. 1 shows a cross-sectional view of a source wafer.

FIG. 1 shows a cross-sectional view of a source wafer 100. The source wafer includes a device coupon 120, formed in this embodiment of three semiconductor layers: a p-doped InP layer 104, an active layer (e.g. quaternary active, MQW, or similar) 106, and an n-doped InP layer 108 which together provide a photonic component (e.g. an electro-absorption modulator, phase modulator, or photodiode). The p-doped InP layer 104 is capped by a p-doped InGaAs layer 102, layer 102 provides a lower metal contact resistance. Below the device coupon 120 is a release layer 110. In this embodiment the release layer is formed from InAlAs and is around 500 nm thick. Beneath the release layer 110 is an intermediate substrate 112 which may, or may not, be made of the same material as wafer substrate 116 (e.g. intrinsic/undoped InP). Beneath the release layer 110 is an etch stop layer 114. The etch stop layer in this embodiment is formed from InGaAsP, which is resistive to the etchant used for wet etching the substrate and/or release layers. During processing, the etched depth will be limited in the intermediate substrate layer 112 between the release layer and the etch stop layer. After the device coupon has been released and lifted away, the remaining intermediate substrate layer 112 can be removed with a wet etch to expose the etch stop 114. Then, if needed, a second wet etching step of the etch stop layer 114 can take place in a manner selective to the wafer substrate 116 (i.e. using an etchant which does not, or does not strongly, interact with the material forming substrate 116). The top surface of the remaining source wafer is flat and smooth and is in a state ready for further epitaxial growth without the need of polishing. In this embodiment the etch stop layer 114 is around 20 nm thick, and the intermediate substrate layer is between 500 nm and 800 nm thick.

Figure 2:
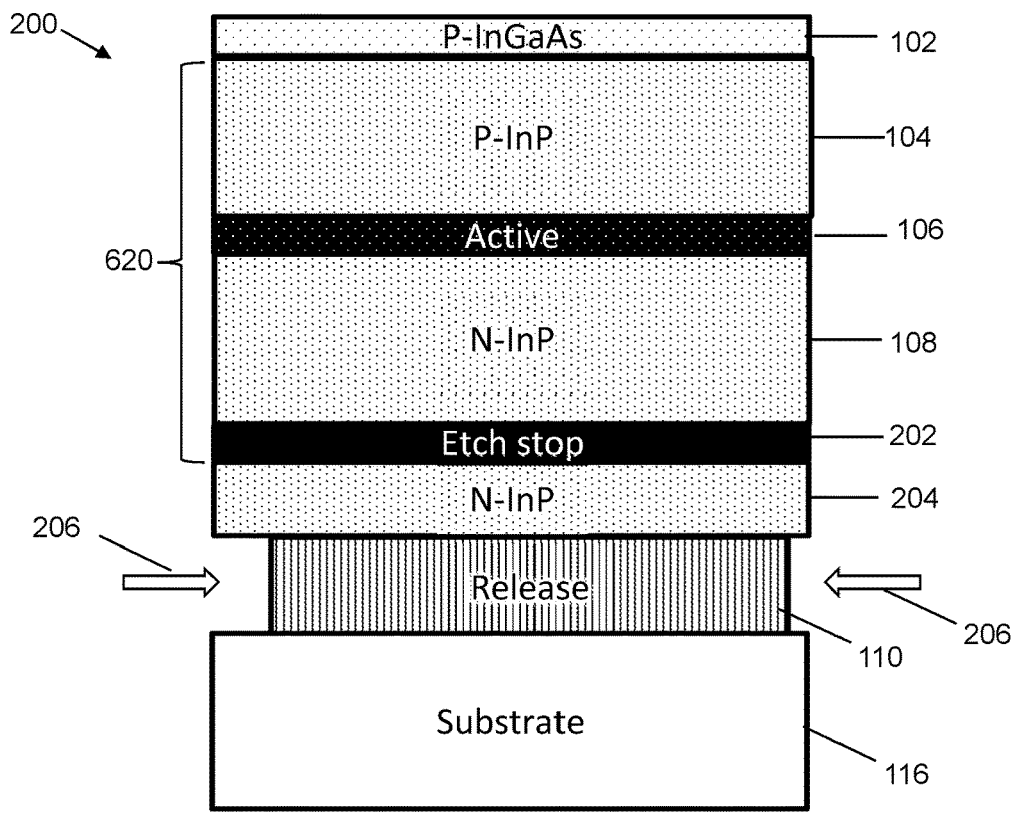
FIG. 2 shows a cross-sectional view of a variant source wafer with the release layer partially etched.

FIG. 2 shows a cross-sectional view of a variant source wafer 200 with the release layer partially etched. Where it shares features with the source wafer 100, like features are indicated by like reference numerals. The source wafer 200 differs from source wafer 100 in that the device coupon 620 includes not only layers 104, 106, and 108, but also an etch stop layer 202. The etch stop layer 202 is formed of InGaAsP in this embodiment. Below the etch stop layer 202 is an intermediate semiconductor layer 204, in this embodiment a further n-doped InP layer, which is sandwiched between the etch stop layer 202 and the release layer 110 (of the type discussed previously). During the release etch to remove the release layer (which is performed through an undercut wet etch), although the etchant has a high etch selectivity between the further n-doped InP layer 204 and the release layer 110 the layer 204 will still be partially etched. Further, as the InP on the edge of layer 204 will be exposed to the etchant earlier than the centre, the layer 204 will end up in a round (e.g. bowing) shape on the lower side due to the edge part being etched longer/more than the centre, especially in a long time undercut release etch process such as used for larger coupons. Arrows 206 show this direction of the etch. With the inserted etch stop layer 202 between the n-doped InP layer 108 and the further n-doped InP layer 204, after the release layer 110 has been fully removed, the further n-doped InP layer 204 can be quickly etched away using the etch stop layer 202 as a hard etch stop. The lower surface of the coupon will therefore be very flat, and an improved yield when printing can be ensured. The etch stop layer can be kept or selectively removed as needed. When removed, the device coupon would not include the etch stop layer 202. The etch stop layer 202 in this embodiment is around 20 nm thick, with the intermediate semiconductor layer being between 100 nm and 300 nm thick. The release layer 110 is around 500 nm thick.

Figure 3:
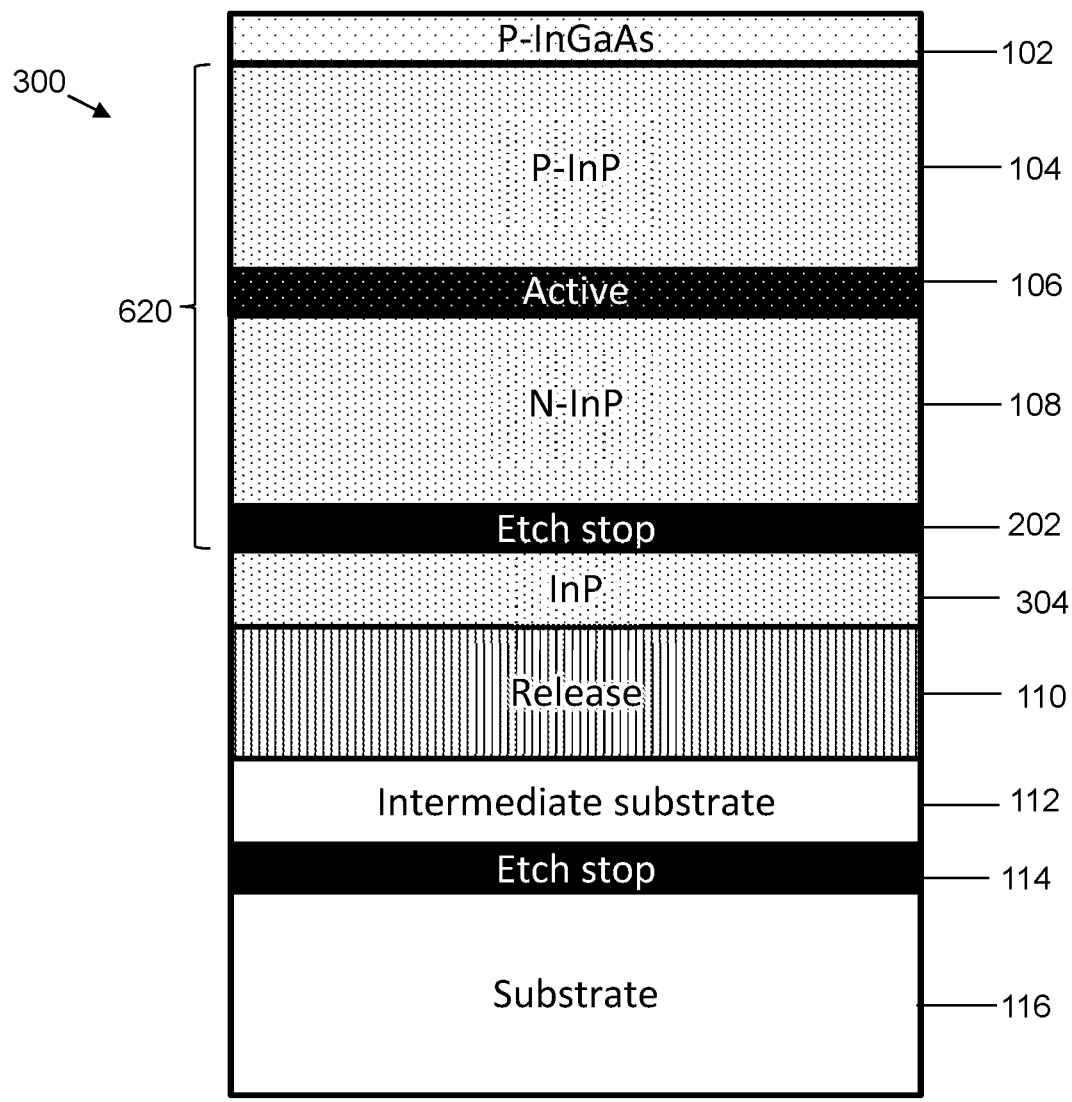
FIG. 3 shows a cross-sectional view of a further variant source wafer.

FIG. 3 shows a cross-sectional view of a further variant source wafer 300. Where it shares features in common with source wafers 100 and 200, like features are indicated by like reference numerals. In essence source wafer 300 is a combination of source wafers 100 and 200 in that it includes a first etch stop layer 202 and a second etch stop layer 114. The source wafer 300 therefore simultaneously provides both: improved flatness of the bottom face of the device coupon 620/120 and also improved reusability of the wafer substrate 116. As before, the etch stop layers may each be around 20 nm thick. The intermediate substrate layer may be between 500 nm and 800 nm thick, with the intermediate semiconductor layer (in this embodiment being undoped InP) 304 being between 100 nm and 300 nm thick. The release layer is around 500 nm thick.

Figure 4:
FIG. 4 shows a variant etch stop layer.

FIG. 4 shows a variant etch stop layer. In the previous examples shown in FIGS. 1 to 3, the etch stop layers have been single layers formed of only a single material. However any of those etch stop layers may be replaced with a plurality of sub-layers, e.g. a first etch stop sub-layer 402 and a second etch stop sub-layer 404, the combination of which can be used as an etch stop layer 114 or 202 of the type discussed previously. This provides protection for a larger range of wet etchants. In this embodiment, the first sub-layer is formed of InGaAsP and the second is formed of InGaAs, although other III-V semiconductor materials can be used.

Further there may be more than two sub-layers. In one example there are four sub-layers, having the composition: InGaAsP/InP/InGaAsP/InP.

Figure 5:
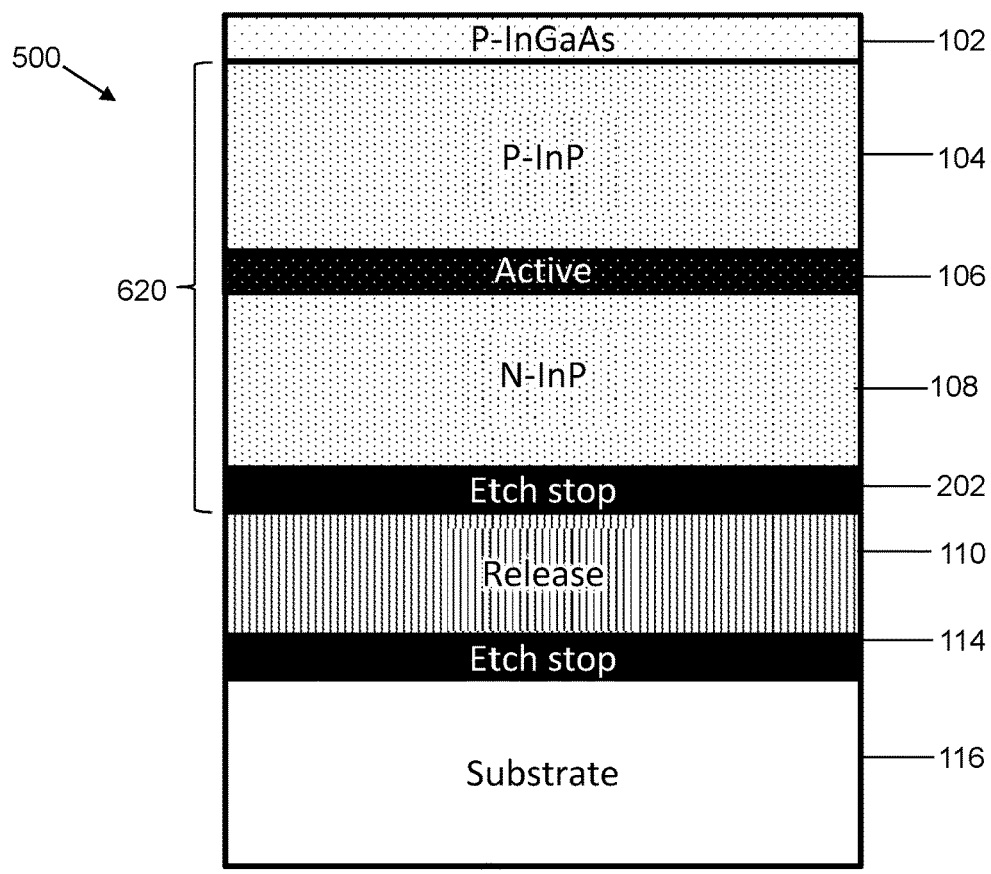
FIG. 5 shows a cross-sectional view of a further variant source wafer.

FIG. 5 shows a cross-sectional view of a further variant source wafer 500. Where it shares features in common with source wafers 100, 200, and 300 like features are indicated by like reference numerals. Source wafer 500 differs from the source wafer 300 in that it does not include the intermediate substrate layer nor the intermediate semiconductor layer. Instead, the first etch stop layer 202 is located directly between the n-doped InP layer 108 and the release layer, and the second etch stop layer 114 is located directly between the release layer 110 and the substrate layer 116. With this further variant, there is no need to provide an intermediate layer, which means there is no need to etch away the intermediate layers. This means less epitaxial growth time and so lower costs.

Figure 6:
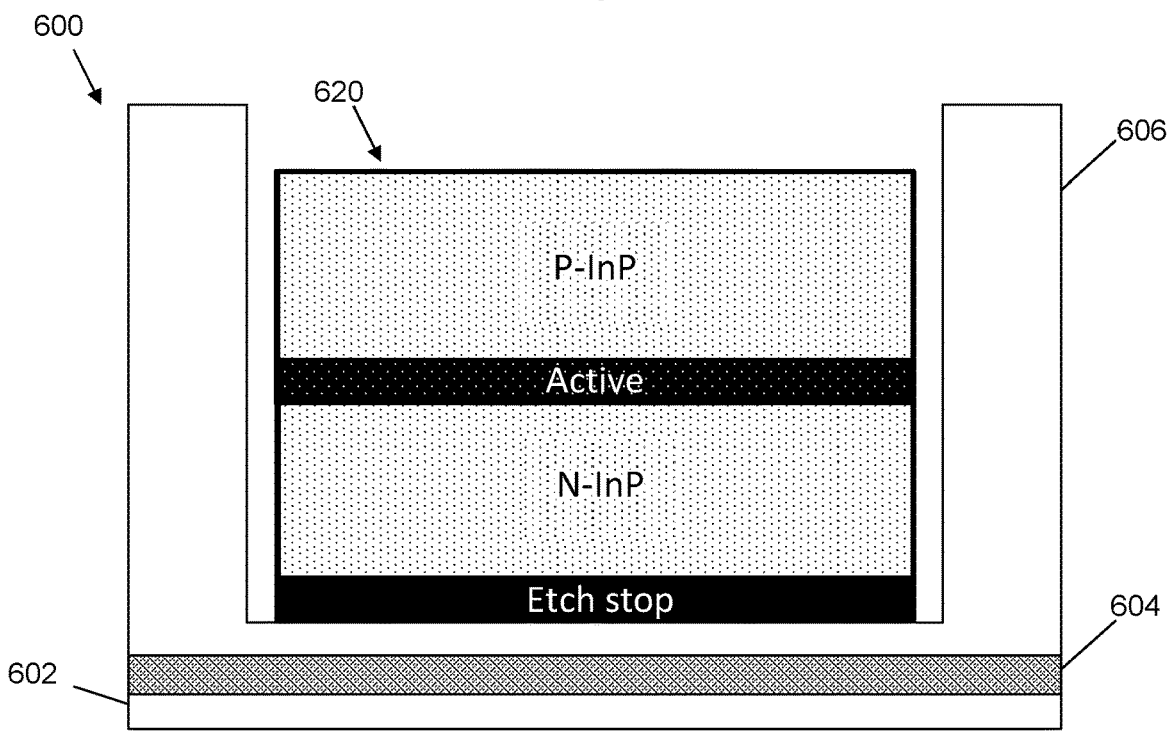
FIG. 6 shows an optoelectronic device.

FIG. 6 shows an optoelectronic device 600. The optoelectronic device 600 includes the device coupon 620 of FIG. 2, 3, or 5 located within a cavity of a platform wafer. The platform wafer includes: a device layer 606, an insulator layer 604, and a substrate layer 602. The device layer may be formed from silicon, the insulator layer may be formed of buried oxide, and the substrate layer may be formed from silicon. Whilst in this embodiment the cavity extends only part way through the device layer, in other embodiments the cavity may extend entirely through the device layer, and in yet further embodiments it may extend entirely through the device layer and the insulator layer so as to contact the substrate layer 602.

The features disclosed in the description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

For the avoidance of any doubt, any theoretical explanations provided herein are provided for the purposes of improving the understanding of a reader. The inventors do not wish to be bound by any of these theoretical explanations.

Any section headings used herein are for organizational purposes only and are not to be construed as limiting the subject matter described.

Throughout this specification, including the claims which follow, unless the context requires otherwise, the word "comprise" and "include", and variations such as "comprises", "comprising", and "including" will be understood to imply the inclusion of a stated integer or step or group of integers or steps but not the exclusion of any other integer or step or group of integers or steps.

It must be noted that, as used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by the use of the antecedent "about" or "around", it will be understood that the particular value forms another embodiment. The term "about" or "around" in relation to a numerical value is optional and means for example +/−10%.

LIST OF FEATURES 100, 200, 300, 500 Source wafer
102 P doped InGaAs layer
104 P doped InP layer
106 Active layer
108 N-doped InP layer
110 Release layer
112 Intermediate substrate
114 Etch stop layer
116 Substrate
120 Device coupon
202 Etch stop layer
204 N doped InP layer
206 Direction of etch
302 InP layer
620 Device coupon
402 First etch stop sub-layer
404 Second etch stop sub-layer
600 Platform wafer
602 Substrate
604 Insulator
606 Sidewalls

The invention claimed is:

1. A source wafer, for use in a micro-transfer printing process, the source wafer comprising:
   a wafer substrate;
   a photonic component, provided in a device coupon, the device coupon being attached to the wafer substrate via a release layer; and
   one or more etch stop layers, located between the photonic component and the wafer substrate,
   wherein a first etch stop layer of the one or more etch stop layers is located between the photonic component and the release layer, and
   wherein the source wafer further comprises an intermediate semiconductor layer, located between the etch stop layer and the release layer.

2. The source wafer of claim 1, wherein a second etch stop layer of the one or more etch stop layers is located between the release layer and the wafer substrate.

3. The source wafer of claim 2, wherein an intermediate substrate layer is located between the release layer and the second etch stop layer.

4. The source wafer of claim 3, wherein the intermediate substrate layer is at least 500 nm thick and no more than 800 nm thick.

5. The source wafer of claim 1, wherein the release layer is at least 450 nm thick and no more than 550 nm thick.

6. A source wafer, for use in a micro-transfer printing process, the source wafer comprising:
   a wafer substrate;
   a photonic component, provided in a device coupon, the device coupon being attached to the wafer substrate via a release layer; and
   one or more etch stop layers, located between the photonic component and the wafer substrate, wherein the or each etch stop layer is formed of a plurality of sub-layers, two or more of the sub-layers of the plurality of sub-layers being formed of respectively different materials.

7. The source wafer of claim 1, wherein the or each etch stop layer is at least 15 nm thick and no more than 25 nm thick.

8. The source wafer of claim 1, wherein the or each etch stop layer is formed from one of InGaAsP, InGaAs, AlInGaAs, or InP.

9. The source wafer of claim 1, wherein the photonic component comprises a plurality of semiconductor layers.

10. The source wafer of claim 1, wherein the wafer substrate is formed of a III-V semiconductor.

11. The source wafer of claim 1, wherein the photonic component is formed, at least in part, of a III-V semiconductor.

12. A method of processing the source wafer of claim 1, the first etch stop layer being provided in the device coupon, and
the method including a step of etching away the release layer, so as to release the device coupon from the wafer substrate.

13. A method of processing the source wafer of claim 1, the one or more etch stop layers comprising a first second etch stop layer located between the release layer and the wafer substrate, and
the method including steps of:
  etching away the release layer;
  lifting away the device coupon; and
  etching away the second etch stop layer, to expose the wafer substrate.

14. The method of claim 13, wherein the source wafer further comprises an intermediate substrate layer, located between the release layer and the second etch stop layer; and the method further comprises etching away the intermediate substrate layer after the device coupon has been lifted away.

15. The method of claim 13, further comprising growing a further release layer on the exposed wafer substrate, and a further device coupon on the further release layer, the further device coupon including a further photonic component.

16. The method of claim 15, further comprising etching away the further release layer, lifting away the further device coupon, and depositing the further device coupon onto a platform wafer so as to provide an optoelectronic device.

17. The method of claim 13, further comprising growing:
  first, a replacement etch stop layer above the wafer substrate;
  second, a replacement release layer, above the replacement etch stop layer; and
  third, a new device coupon including a new photonic component, atop the replacement release layer.

* * * * *